United States Patent
Hirai et al.

(10) Patent No.: US 6,207,473 B1
(45) Date of Patent: Mar. 27, 2001

(54) PROCESS FOR MANUFACTURING SEMICONDUCTOR WAFER, PROCESS FOR MANUFACTURING SEMICONDUCTOR CHIP, AND IC CARD

(75) Inventors: Minoru Hirai; Shigeyuki Ueda; Osamu Miyata; Tomoharu Horio, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/147,824

(22) PCT Filed: Jul. 6, 1998

(86) PCT No.: PCT/JP98/03048

§ 371 Date: Mar. 15, 1999

§ 102(e) Date: Mar. 15, 1999

(87) PCT Pub. No.: WO99/04419

PCT Pub. Date: Jan. 28, 1999

(30) Foreign Application Priority Data

Jul. 17, 1997 (JP) .................................................. 9-192203

(51) Int. Cl.[7] ........................... H01L 21/46; H01L 21/70; H01L 21/301
(52) U.S. Cl. ......................... 438/106; 438/113; 438/462; 438/613; 257/620
(58) Field of Search .................... 257/620; 438/106, 438/460, 462, 110, 113, 612, 613

(56) References Cited

U.S. PATENT DOCUMENTS

| | | |
|---|---|---|
| 5,270,253 | 12/1993 | Arai et al. . |
| 5,414,297 | * 5/1995 | Morita et al. . |
| 5,546,279 | 8/1996 | Aota et al. . |
| 5,899,729 | * 5/1999 | Lee . |

FOREIGN PATENT DOCUMENTS

| | | |
|---|---|---|
| 0 860 280 | 8/1998 | (EP) . |
| 62-54938 | 3/1987 | (JP) . |
| 62-161511 | 7/1987 | (JP) . |
| 6-77280 | 3/1994 | (JP) . |
| 10-27827 | 1/1998 | (JP) . |
| 96/37917 | 11/1996 | (WO) . |

OTHER PUBLICATIONS

Patent Abstracts of Japan, vol. 098, No. 012, Oct. 31, 1998 & JP 10–199927 (Texas Instruments Japan Ltd.), Jul. 31, 1998.

* cited by examiner

Primary Examiner—Kevin M. Picardet
Assistant Examiner—D. M. Collins
(74) Attorney, Agent, or Firm—Arent Fox Kintner Plotkin & Kahn, PLLC

(57) ABSTRACT

A manufacturing method includes the steps of integrally fabricating a plurality of circuit elements (41) on a substrate (1a), forming electrode bumps (11) on electrode pads (11b) conducting with circuit elements (41), forming a scribe line or a scribe line mark (21a) at a prescribed position of substrate (1a), and sticking an anisotropically conductive film (30) to cover each of the electrode bumps (11) and the scribe line or the scribe line mark (21a). The step of forming the electrode bumps (11) and the step of forming the scribe line or the scribe line mark (21a) are performed simultaneously. The electrode bumps (11) and the scribe line or the scribe line mark (21a) are preferably formed of gold. By the manufacturing method, even when an anisotropically conductive film is stuck on a semiconductor wafer having a plurality of circuit elements formed, the circuit elements can be diced as desired.

12 Claims, 6 Drawing Sheets

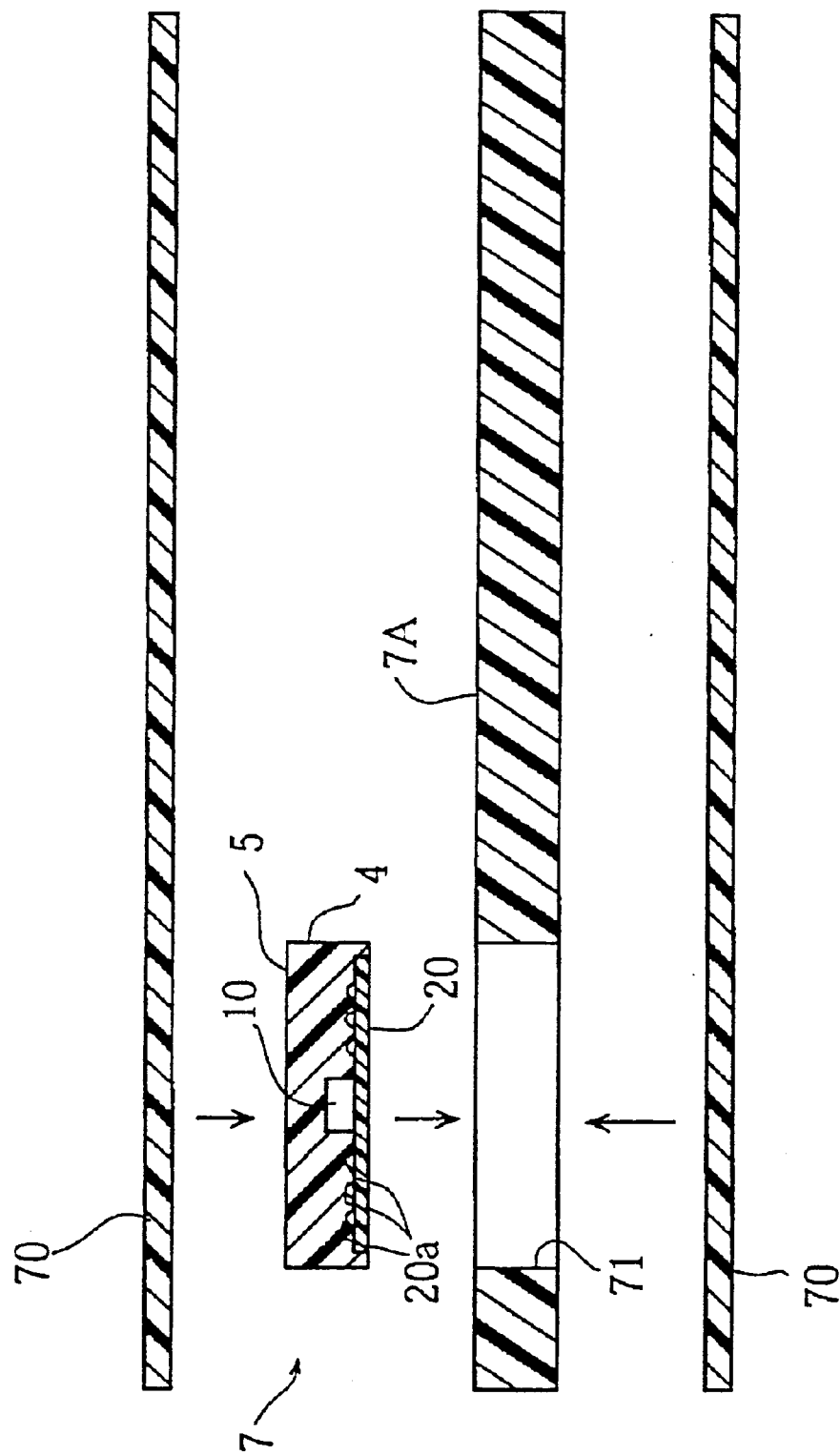

PROCESS FOR MANUFACTURING SEMICONDUCTOR WAFER, PROCESS FOR MANUFACTURING SEMICONDUCTOR CHIP, AND IC CARD

TECHNICAL FIELD

The present invention relates to a method manufacturing a semiconductor wafer having circuit elements integrally fabricated on a substrate, a semiconductor wafer manufactured by this method, a method of manufacturing semiconductor chips from the semiconductor wafer, the semiconductor chips manufactured by this method, and an IC card provided with the semiconductor chip.

BACKGROUND ART

FIG. 7 is an enlarged view of an insulating substrate 20 having a prescribed wiring pattern with a semiconductor chip 10 mounted by a so-called chip-on-board method. In an example of the chip-on-board method, an anisotropically conductive film 30 is interposed between insulating substrate 20 having conductor bumps 21 formed protruding upward and semiconductor chip 10 having electrode bumps 11 protruded from a main surface 10a, and these are heated and pressed so that conductor bumps 21 and electrode bumps 11 are conducted and connected.

As can be seen best from FIG. 7, anisotropically conductive film 30 has such a structure in that conductive particles 32 are dispersed in an adhesive resin film 31, and conductor bumps 21 and electrode bumps 11 are conducted and connected to each other as conductive particles 32 are interposed therebetween. An area of the main surface 10a of semiconductor chip 10 where electrode bumps 11 are not formed is adhered to insulating substrate 20 by the adhesiveness of resin film 31 provided when anisotropically conductive film 30 is heated, melt and thereafter solidified. At this time, the conductive particles 32 are dispersed in resin film 31 and separate from each other, and therefore insulation in this region is maintained. In the above described method of mounting, by only a simple operation of pressing semiconductor chip 10 and insulating substrate 20 to each other with anisotropically conductive film 30 interposed, it is possible to mount semiconductor chip 10 on insulating substrate 20 while attaining electrical conduction only at necessary portions. Therefore, as compared with mounting of semiconductor chip 10 on insulating substrate 20 through so called chip bonding and wire bonding, the method is very simple and convenient.

When semiconductor chip 10 is to be mounted on insulating substrate 20 utilizing anisotropically conductive film 30 however, it is necessary to prepare very small anisotropically conductive film having 4 sides each being about a few mm corresponding to the size of semiconductor chip 10 to be mounted, in the same number as the number of semiconductor chips 10 to be mounted. Further, prior to mounting of semiconductor chips 10, it is necessary to place anisotropically conductive films 30 one by one on conductor bumps 21 of insulating substrate 20 or to stick the films one by one on the main surface 10a of semiconductor chips 10. Thus, the conventional method of mounting utilizing anisotropically conductive film 30 has poor workability in preparation preceding mounting of the semiconductor chips 10.

In view of the foregoing, a method has been proposed in which anisotropically conductive film 30 is stuck entirely over a circuit element forming region of a semiconductor wafer on which a plurality of circuit elements, which are to be the semiconductor chips 10, are formed, and the anisotropically conductive film 30 is diced simultaneously with dicing of the circuit elements. In the above described method, when the circuit elements are divided into individual semiconductor chips 10, anisotropically conductive film 30 is stuck on main surface 10a, and the method has an advantage that any special preparation is not necessary prior to mounting of the semiconductor chip 10.

Generally, a semiconductor wafer has so called scribe lines formed at appropriate positions, and the wafer is diced into circuit elements by a diamond cutter, for example, using the scribe lines as reference marks. The scribe line is formed, for example, simultaneously with the step of forming a pattern of a passivation film. Now, as described above, anisotropically conductive film 30 has such a structure in that a number of conductive particles 32 are dispersed in resin film 31. Therefore, the color of anisotropically conductive film 30 is milky white. When anisotropically conductive film 30 is stuck on the semiconductor wafer, it becomes necessary to recognize silver scribe lines formed of SiN or the like through milky white anisotropically conductive film. This causes difficulty in visually recognizing the scribe lines, and hence difficulty in dicing the circuit elements to obtain desired semiconductor chips 10.

DISCLOSURE OF THE INVENTION

An object of the present invention is to solve the above described problem of the prior art, and to enable dicing of circuit elements as desired even when an anisotropically conductive film is stuck on a semiconductor wafer having a plurality of circuit elements formed thereon.

In order to attain the above described objects, the present invention provides the following technical measure.

More specifically, according to a first aspect of the present invention, the method of manufacturing a semiconductor wafer includes the steps of integrally fabricating a plurality of circuit elements on a substrate, forming electrode bumps on electrode pads conducting to respective circuit elements, forming scribe lines or scribe line marks at prescribed positions of the substrate, and sticking an anisotropically conductive film to cover respective electrode bumps and scribe lines or scribe line marks, wherein the step of forming respective electrode banks and the step of forming the scribe lines or scribe line marks are performed simultaneously.

When a semiconductor chip is to be mounted on the substrate using the anisotropically conductive film, it is necessary to form an electrode bump protruding from the main surface of the semiconductor chip on the electrode pad which is conducted to the circuit element. The electrode bump is formed on the electrode pad after a prescribed wiring pattern including the electrode pad is formed. According to the manufacturing method described above, the step of forming respective electrode bumps and the step of forming the scribe lines or scribe line marks are performed simultaneously. More specifically, a new step is not necessary for forming the scribe lines or the scribe line marks, and it is possible to form the scribe lines or scribe line marks at prescribed positions in the step essential in manufacturing the semiconductor wafer.

In a preferred embodiment, the step of forming respective electrode bumps and scribe lines or scribe line marks includes the steps of forming an insulating layer protecting the circuit elements while exposing upper surfaces of the electrode pads, forming a barrier metal layer entirely over the circuit element forming region on the substrate, forming a photo resist layer such that portions corresponding to regions where respective electrode pads are formed and portions on which the scribe lines or scribe line marks are to be formed can been seen, forming a metal layer at portions where the photo resist layer is not formed, and removing the photo resist layer and the barrier metal layer.

In the manufacturing method described above, by dipping the substrate on which the photo resist layer has been formed in a solution containing metal ions, for example, and by applying electric power using the barrier metal layer as a negative electrode, a metal layer is grown on regions where the photo resist layer is not formed, and in this manner, respective electrode bumps and the scribe lines or scribe line marks can be formed simultaneously. More specifically, simply by not forming the photo resist layer at portions where the scribe lines or scribe line marks are to be formed when the photo resist layer is formed, the scribe lines or the scribe line marks can be formed simultaneously with the electrode bumps.

In a preferred embodiment, the electrode bumps and the scribe lines or scribe line marks are formed of gold.

As described above, generally, the conventional scribe lines have been formed simultaneously with passivation, and in that case, the scribe lines have been formed of the same material as passivation, for example, SiN. Therefore, when the anisotropically conductive film is stuck, it has been necessary to recognize silver scribe lines through the milky white anisotropically conductive film, and therefore it has been difficult to visually recognize the scribe lines. By contrast, as the scribe lines or scribe line marks are formed of gold in the preferred embodiment described above, the scribe lines or the scribe line marks can readily be visually recognized through the anisotropically conductive film, and therefore dicing of the semiconductor wafer into circuit elements as desired is facilitated.

The semiconductor wafer manufactured in accordance with the method of manufacturing a semiconductor wafer in accordance with the above described first aspect of the present invention has the scribe lines or the scribe line marks formed at prescribed positions, and the semiconductor wafer includes a substrate on which a plurality of circuit elements are fabricated integrally, electrode bumps formed simultaneously with the scribe lines or the scribe line marks on electrode pads to be conducted to respective circuit elements, and an anisotropically conductive film stuck on the substrate to cover respective electrode bumps and the scribe lines or the scribe line marks.

For the semiconductor wafer having such a structure, it is readily possible to form the scribe lines or the scribe line marks through the method of manufacturing in accordance with the first aspect described above. Especially when the scribe lines or the scribe line marks are formed of gold, the scribe lines or the scribe line marks can readily be visually recognized through the anisotropically conductive film stuck thereon, and therefore the lines or the marks can satisfactorily be utilized as reference marks for dicing the semiconductor wafer into the circuit elements.

The method of manufacturing a semiconductor chip in accordance with a second aspect of the present invention includes the step of dicing the semiconductor wafer formed through the method of manufacturing according to the first aspect described above, into respective circuit elements using the scribe lines or scribe line marks as reference marks.

As already described, the scribe lines or scribe line marks formed on the semiconductor wafer can readily be visually recognized, and therefore it goes without saying that the lines or the marks facilitate the step of dicing into the circuit elements in a desired manner.

Further, on the main surface of the semiconductor chip manufactured by this manufacturing method, the anisotropically conductive film has already been stuck when the semiconductor wafer is diced into respective circuit elements. Therefore, when the semiconductor chips are to be mounted on the insulating substrate, it is not necessary to newly provide the anisotropically conductive films having four sides of about a few mm corresponding to the size of the semiconductor chip to be mounted by the same number as the semiconductor chips to be mounted. Further, it is not necessary to place the anisotropically conductive films on the conductor bumps of the insulating substrate or to stick the films one by one on the main surface of the semiconductor chips, prior to mounting of the semiconductor chips. Therefore, the semiconductor chip is advantageous that it eliminates the necessity of any special preparation prior to mounting of the semiconductor chip.

The IC card in accordance with a third aspect of the present invention is provided by mounting the semiconductor chip formed by the manufacturing method in accordance with the second aspect described above on an insulating substrate, and by embedding the insulating substrate on which the semiconductor chip is mounted and an antenna coil conducting to the semiconductor chip in a card formed of resin.

BRIEF DESCRIPTION OF DRAWINGS

FIG. 8 is an exploded side view showing an example of an IC card in accordance with the present invention.

BEST MODE FOR CARRIED OUT THE INVENTION

A preferred embodiment of the present invention will be described specifically with reference to the drawings.

Figure 1:
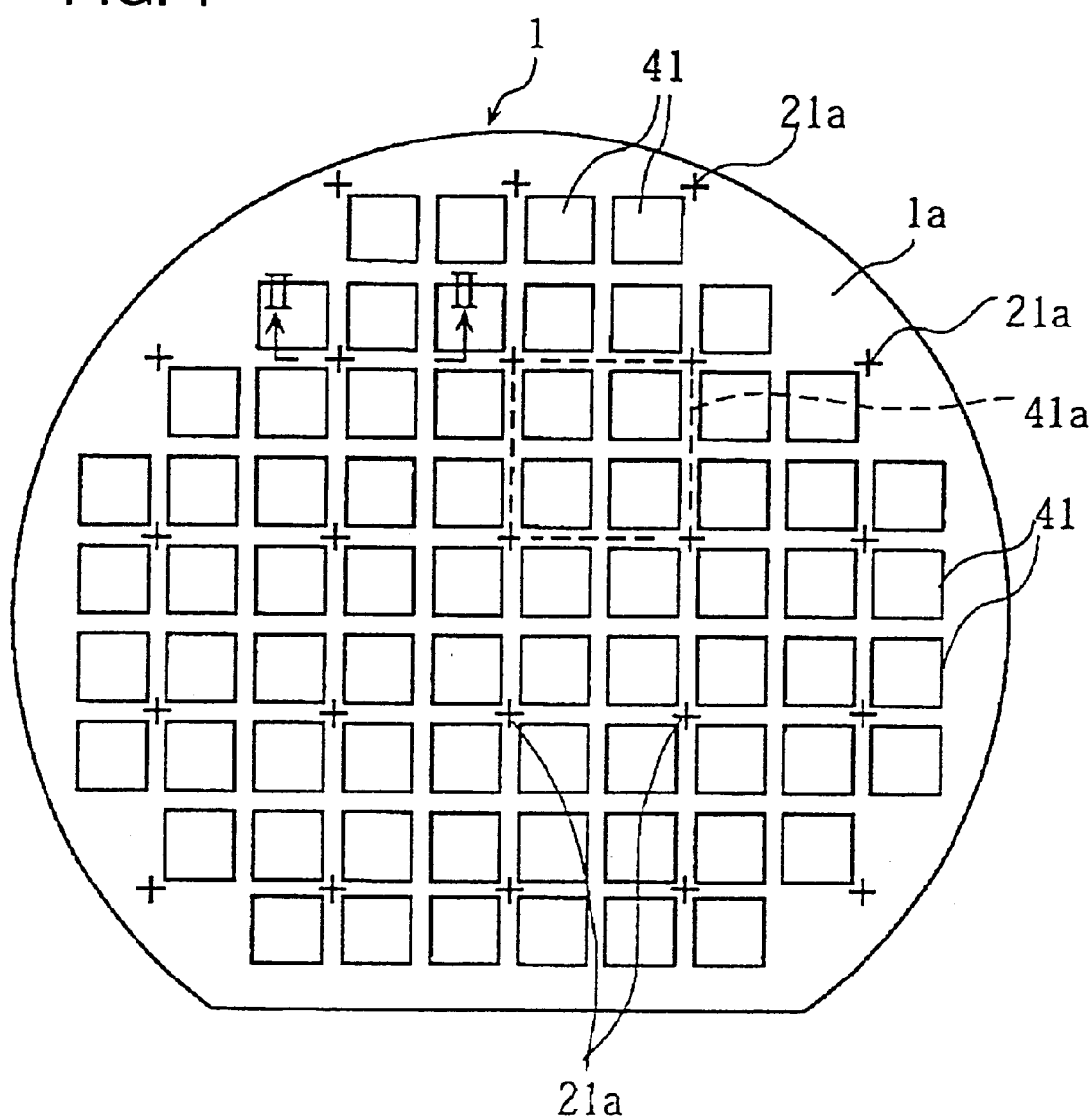
FIG. 1 is an overall plan view showing an example of a semiconductor wafer in accordance with the present invention.
Figure 2:
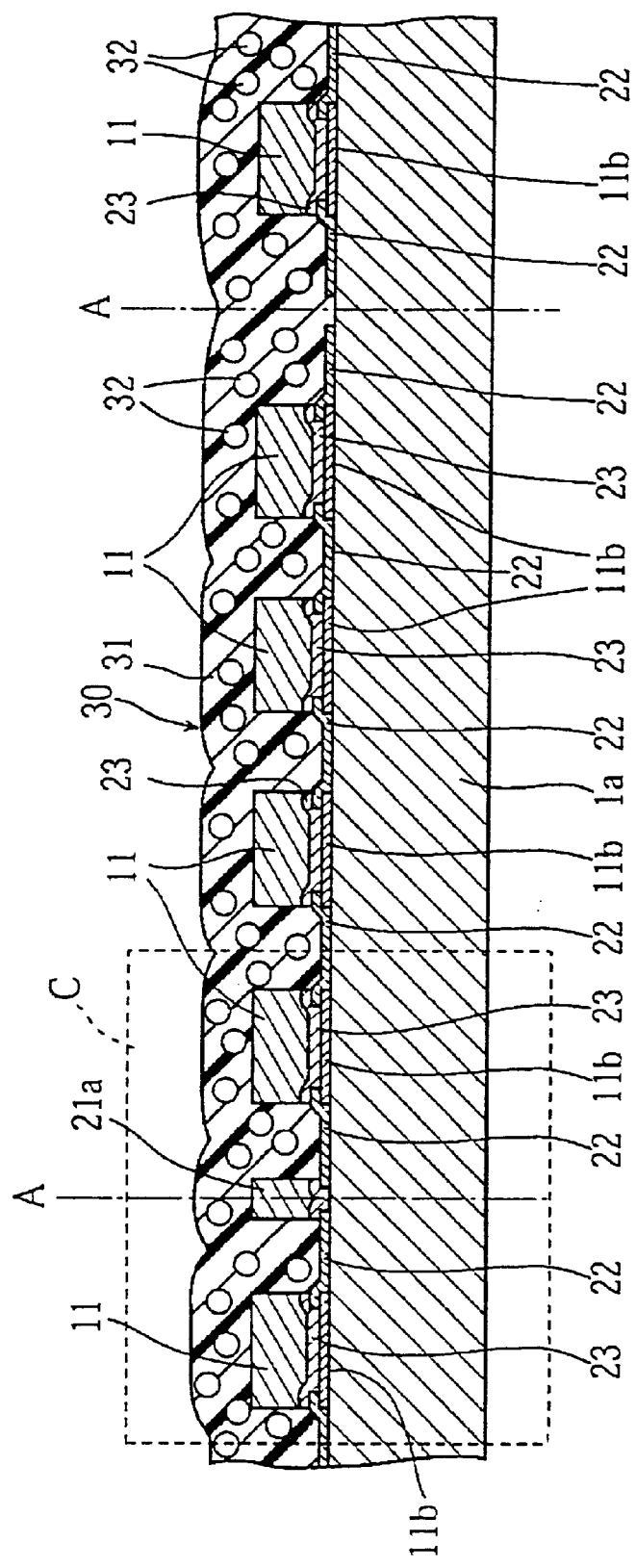
FIG. 2 is a cross section taken along the line II—II of FIG. 1.

As can be seen from FIGS. 1 and 2, a semiconductor wafer 1 is formed in a disk shape with a part cut flat, and on a substrate 1a formed of silicon, for example, circuit elements 41 are formed integrally. On the surface of substrate 1a, scribe line marks 21a are formed at prescribed positions, and electrode pads 11b to be conducted with circuit elements 41 are formed. By electroplating, for example, electrode bumps 11 are formed on electrode pads 1b. On substrate 1a on which electrode bumps 11 and scribe line marks 21a are formed, an anisotropically conductive film 30 is stuck to cover these elements.

Scribe line marks 21a may be formed simultaneously when the electrode bumps 11 are formed, for example. The scribe line mark is formed at a position near each corner of a group 41a of circuit elements which group includes 4 circuit elements 41 as a unit, as surrounded by the dotted line in FIG. 1. The shape of the scribe line mark 21a is not limited to such a cross shape as shown in FIG. 1, and it may be formed as a linear scribe line.

The method of manufacturing semiconductor wafer 1 will be briefly described with reference to FIGS. 3A to 3F. Cross sections of FIGS. 3A to 3F correspond to the portion surrounded by a chain line in FIG. 2.

Figure 3A:
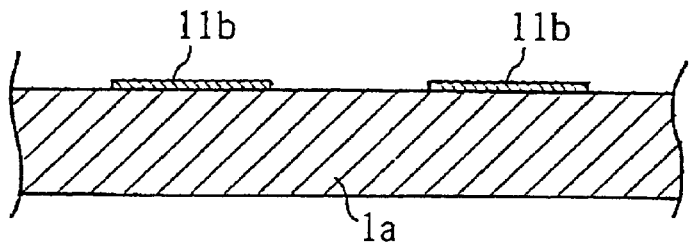
FIGS. 3A to 3F are cross sections of a main portion showing an example of the steps of manufacturing the semiconductor chip.

First, on a substrate 1a formed of silicon, for example, which has a disk shape with a portion cut away flat, circuit elements 41 are fabricated integrally, and, referring to FIG. 3A, electrode pads 11b which are conducted to the circuit elements 41 are formed together with a prescribed wiring pattern. The electrode pad 11b is formed, for example, by forming a metal coating layer of aluminum or the like by sputtering or vacuum deposition, for example, and by etching the metal coating layer.

Figure 3B:
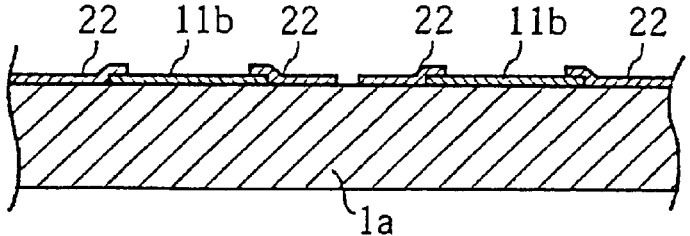

Thereafter, referring to FIG. 3B, an insulating film 22, that is, a passivation film is formed, for example, by CVD method to expose upper surfaces of electrode pads 11b and covering peripheral edges of electrode pads 11b, so as to protect circuit elements 41 and the wiring pattern.

Figure 3C:
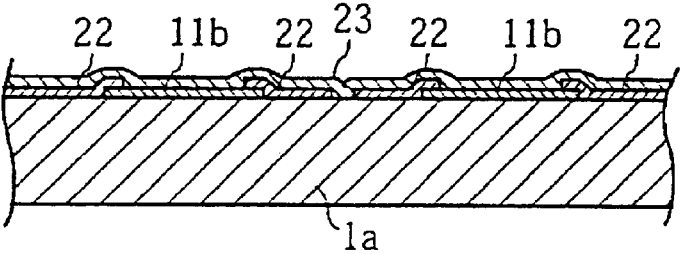

Thereafter, referring to FIG. 3C, a barrier metal layer 23 is formed to cover entirely the region for forming circuit elements 41 of substrate 1a. Barrier metal layer 23 has a structure having a titanium layer and a platinum layer stuck thereon, with the titanium layer being formed to about 2000 Å and the platinum layer to about 1000 Å. The barrier metal layer 23 is also formed by sputtering or vacuum deposition.

Figure 3D:
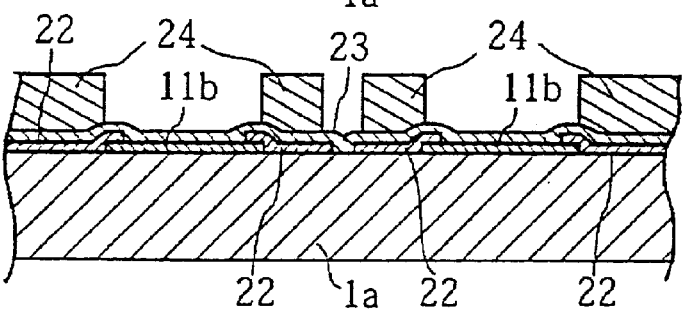

Thereafter, referring to FIG. 3D, except on regions where electrode bumps 11 are to be formed on electrode pads 11a and where scribe line marks 21a are to be formed, photo resist layer 24 is formed, for example, by depositing a photo sensitive resin on barrier metal layer 23, exposing with a prescribed mask and developing the photo sensitive resin.

Figure 3E:
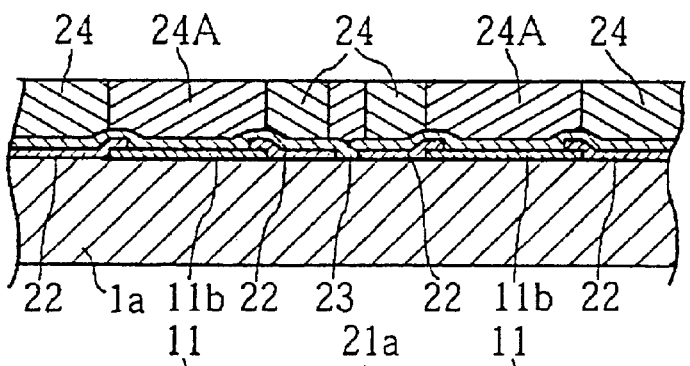

Referring to FIG. 3E, on regions where the photo resist 24 has not been formed, that is, on regions where electrode bumps 11 and scribe line marks 21a are to be formed, a metal layer 24A of gold, for example, is formed. Metal layer 24A is formed, for example, by electroplating. More specifically, when metal layer 24A of gold is to be formed by electroplating, substrate 1a on which photo resist 24 has been formed is dipped in a solution containing gold ions, and electric power is applied with barrier metal layer 23 serving as a negative electrode. Here, on regions of barrier metal layer 23 where photo resist 24 is not formed, metal layer 24A of gold grows whereby plated metal layer 24a, which will be the electrode bumps 11 and scribe line marks 21a, is formed.

Figure 3F:
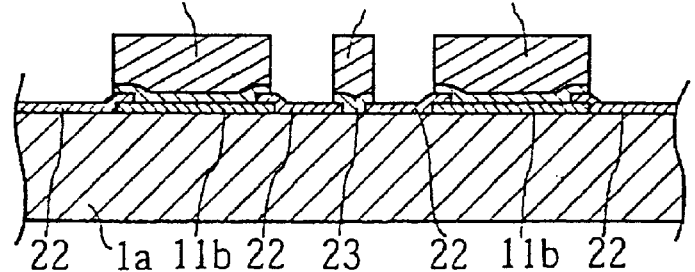

Referring to FIG. 3F, photo resist layer 24 is removed to expose barrier metal layer 23, and barrier metal layer 23 is chemically processed to expose insulating film 22. In this manner, metal layer 24A is formed as electrode bumps 11 and scribe line marks 21a. More specifically, according to the manufacturing method described above, when photo resist layer 24 is formed, simply by not forming photo resist layer 24 at portions where scribe line marks 21a are to be formed, it becomes possible to form scribe line marks 21a simultaneously with electrode bumps 11. Therefore, it is possible to form scribe line marks 21a at prescribed positions in a step essential for manufacturing semiconductor wafer 1, without necessitating any new step to form the scribe line marks 21a.

Finally, by sticking anisotropically conductive film 30 on that surface of semiconductor wafer 1 on which circuit elements 41 are formed, semiconductor wafer 1 such as shown in FIGS. 1 and 2 is formed. Anisotropically conductive film 30 may be stuck by using a resin adhesive, or it may be stuck utilizing adhesiveness of anisotropically conductive film 30 by heating anisotropically conductive film 30.

Figure 4:
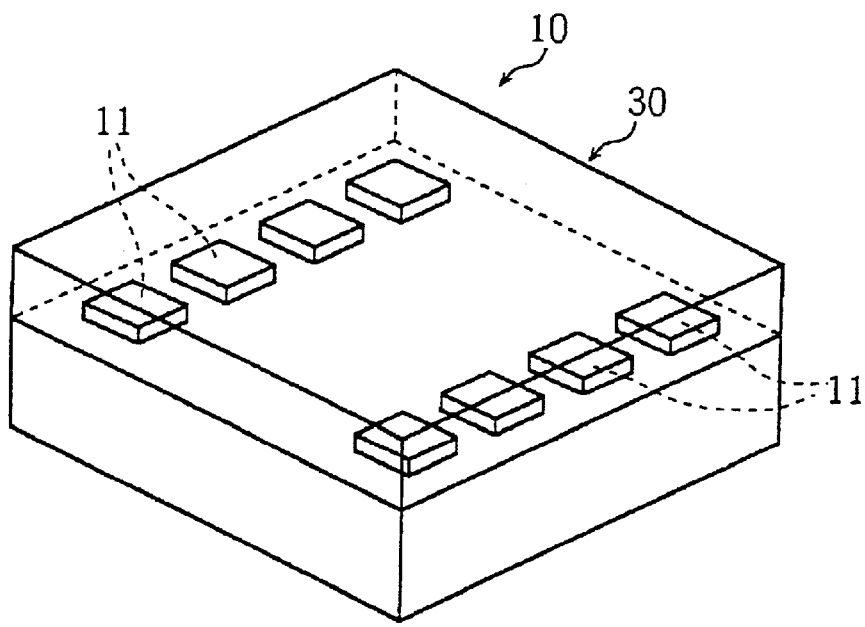
FIG. 4 is an overall perspective view showing an example of the semiconductor chip in accordance with the present invention.

Semiconductor wafer 1 manufactured through the above described manufacturing method is cut along the line represented by chain dotted line is FIG. 2, and diced into each circuit element 41 to be an individual semiconductor chip 10 shown in FIG. 4. Dicing of semiconductor wafer 1 is done by using a diamond cutter, scribe line marks 21a serving as reference marks. This operation is facilitated by the scribe line marks 21a formed of gold. As will be described later, anisotropically conductive film 30 is milky white, as it has conductive particles 32 dispersed on resin 31 and when the scribe line marks are formed of gold, visual recognition is very much facilitated as compared with the marks formed of SiN, for example. Accordingly, it is facilitated to dice the semiconductor wafer 1 circuit element 41 by circuit element 41 as desired, using scribe line marks 21a as reference marks.

Figure 5:
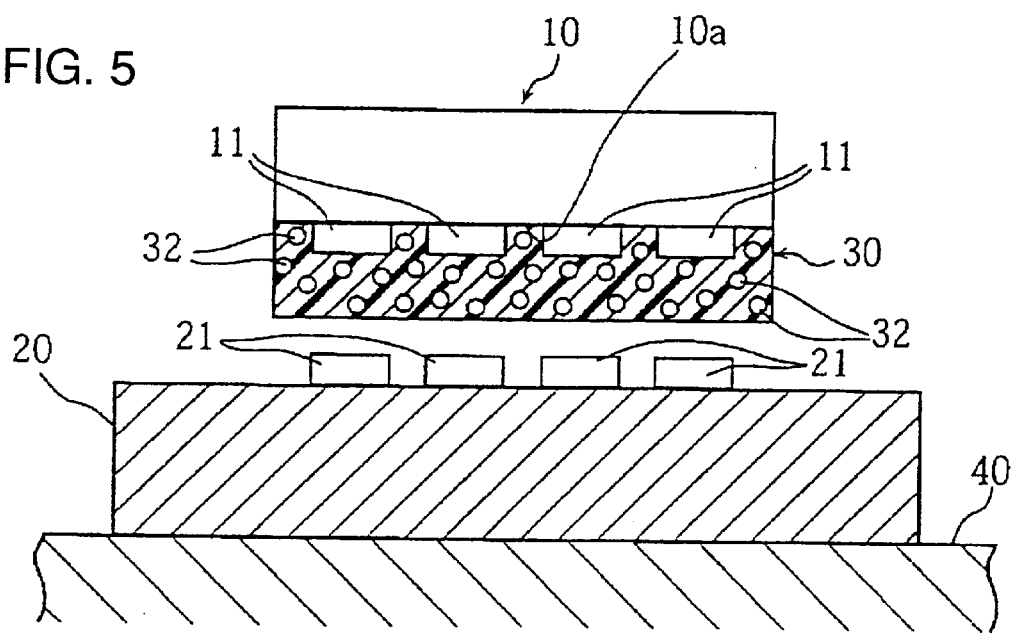
FIG. 5 is a cross section showing the semiconductor chip being mounted on an insulating substrate.
Figure 6:
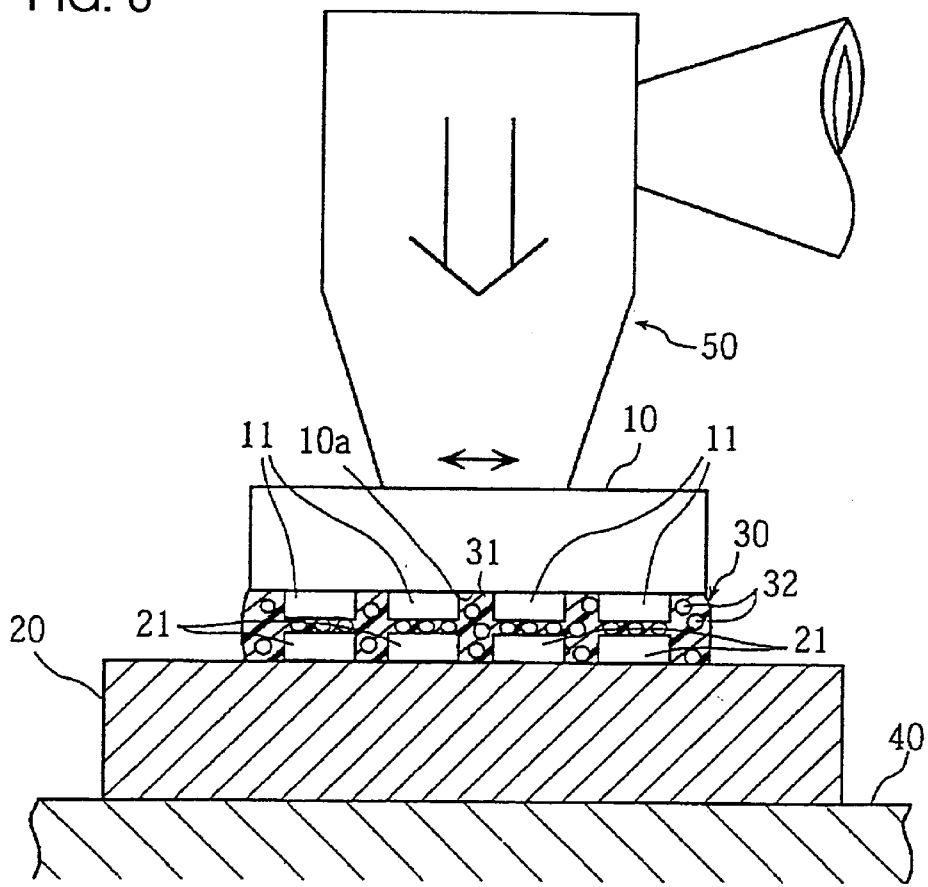
FIG. 6 shows the semiconductor chip and the insulating substrate pressed to each other.
Figure 7:
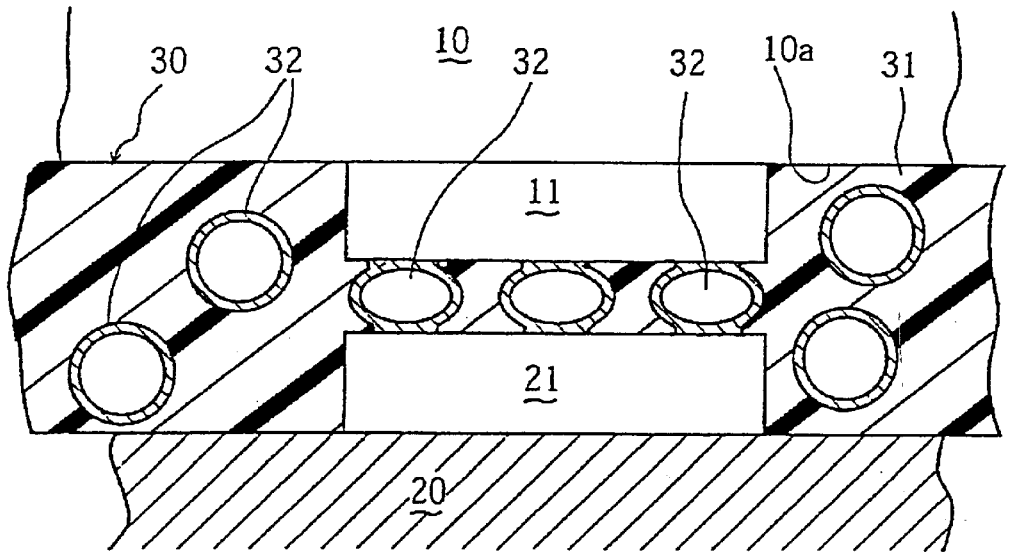
FIG. 7 is a cross section of a main portion showing a state of conduction and connection between electrode bumps formed on the semiconductor chip and conductor bumps formed on the insulating substrate.

Semiconductor chip 10 manufactured in the above described manner with anisotropically conductive film 30 stuck thereon is mounted on an insulating substrate and used for various applications. Referring to FIGS. 5 to 7, the step of mounting semiconductor chip 10 on insulating substrate 20 will be briefly described. FIG. 5 shows a state in which semiconductor chip 10 having anisotropically conductive film 30 is to be placed on insulating substrate 20, FIG. 6 shows a state in which semiconductor chip 10 and insulating substrate 20 are pressed to each other, and FIG. 7 is an enlarged view of a main portion of FIG. 6. In the present embodiment, semiconductor chip 10 will be described assuming that it has a semiconductor memory, a capacitor and the like fabricated integrally, which will be embedded together with an antenna coil and the like in a resin card to be used as a so called IC card.

Prior to the description of the step of mounting semiconductor chip 10, anisotropically conductive film 30 and insulating substrate 20 on which semiconductor chip 10 is mounted will be briefly described.

As can be best seen in FIG. 5, anisotropically conductive film 30 has such a structure in that conductive particles 32 are dispersed in insulative resin film 31. As conductive particles 32, metal spheres, resin balls with surfaces plated with nickel or plated with nickel and further with gold may used. Thickness of anisotropically conductive film 30 in a natural state is set to 30 to 50 μm and diameter of conductive particles 32 is set to 5 μm, for example.

Insulating substrate 20 on which semiconductor chip 10 is to be mounted is formed of an insulative polyimid resin or the like, and on its surface, a wiring pattern including an antenna coil 20a is formed by forming a copper coating followed by a prescribed pattern etching (see FIG. 8). As shown in FIG. 8, on the surface of insulating substrate 20, a conductive pad is formed to be conducted with the wiring pattern. On conductive pad, a conductor 21 is formed and exposed by nickel plating and gold plating. Regions of the insulating substrate 20 other than the exposed and formed conductor 21 are generally covered by an insulating film such as polyimid resin. As can be best seen from FIG. 5, conductor 21 protrudes slightly from the surface of insulating substrate 20, because of the thickness of the copper wiring pattern.

As shown in FIGS. 5 and 6, semiconductor chip 10 having anisotropically conductive film 30 manufactured in the above described manner is positioned with anisotropically conductive film 30 facing downward such that electrode bumps 11 correspond to conductors 21 of insulating substrate 20, and pressed with a prescribed pressure. At this time, a support base 40 on which insulating substrate 20 is placed is heated to about 180°, for example, by a heater incorporated therein (not shown).

As shown in FIG. 6, semiconductor chip 10 is pressed onto insulating substrate 20 by using a pressing device 50, for example.

When a selected region of anisotropically conductive film 30 is heated and pressurized in a thickness direction, resin component becomes soft and squashed. In the example described above, electrode bumps 11 of semiconductor chip 10 and conductor bumps 21 of insulating substrate 20 are both protruding, and therefore, of anisotropically conductive film 30, a region between opposing electrode bump 11 and conductor bump 21 is selectively squashed. As a result, as can be seen from FIG. 7, conductive particles 32 dispersed in the resin comes to be in contact with electrode bump 11 and conductor bump 21. Of anisotropically conductive film 30, a region not interposed between electrode bump 11 and conductor 21 is not squashed or squashed only to a small extent, and therefore, conductive particles 32 therein are still dispersed in the thickness direction of anisotropically conductive film 30. Therefore, insulation between regions on both surfaces of semiconductor chip 10 and insulating substrate 20 other than regions of electrode bumps 11 and conductor bumps 21 is maintained.

In the present invention, anisotropically conductive film 30 is stuck on semiconductor wafer 1 in the state of the wafer, and a semiconductor chip 10 obtained by dicing the wafer is mounted on insulating substrate 20. Therefore, when semiconductor chip 10 is to be mounted, it is not necessary to newly provide anisotropically conductive film 30 of very small size corresponding to the size of semiconductor chip 10 to be mounted, by the same number as semiconductor chips 10 to be mounted. Further, before mounting semiconductor chip 10, it is not necessary to place anisotropically conductive film 30 one by one on conductor bumps 21 of insulating substrate 20 or to stick the films on main surface 10a of the semiconductor chips 10. Therefore, semiconductor chip 10 manufactured in the above described manner is advantageous in that any special preparation is not necessary before mounting the semiconductor chip 10.

As can be best seen FIG. 8, insulating substrate 20 with semiconductor chip 10 mounted in the above described manner is resin packed and formed as a module, by transfer molding using a thermosetting resin such as epoxy resin or by injection molding using a thermoplastic resin.

An IC module 5 provided as a module with resin package 4 formed in the above described manner is fitted in a resin card 70a having a through hole 71 corresponding to the shape of IC module 5 formed of polyethylene terephtalate (hereinafter referred to as "PET") or polyvinyl chloride (hereinafter referred to as "PVC"). When IC module 5 is fitted in resin card 70A, an epoxy resin based adhesive may be used, for example. Resin card 70A with IC module 5 fitted in this manner has cover sheets 70, 70 each formed to have the thickness of above 0.05 mm stuck on upper and lower surfaces by PET or PVC, for example. Thus, IC card 70, and especially, IC module 5 is protected.

In the above described embodiment, insulating substrate 20 on which a semiconductor chip is mounted is resin packed. However, insulating substrate 20 with the semiconductor chip 10 mounted without resin packaging may be fitted in resin card 70A.

In IC card 7, antenna coil 20a is formed as a pattern on insulating substrate 20. Antenna coil 20a, however, may a be a wound coil formed as a separate body, by winding metal wire.

What is claimed is:

1. A method of manufacturing a semiconductor wafer, comprising the steps of:

fabricating a plurality of circuit elements integrally on a substrate;

forming electrode bumps on electrode pads conducting to respective said circuit elements;

forming a scribe line or a scribe line mark at a prescribed position on said substrate; and sticking an anisotropically conductive film to cover said electrode bumps and said scribe lines or scribe line mark; wherein said step of forming said electrode bump and said step of forming the scribe lines or scribe line mark are performed simultaneously.

2. The method of manufacturing a semiconductor wafer according to claim 1, wherein said step of forming said electrode bump and said scribe line or scribe line mark includes the step of: forming an insulating layer protecting each of said circuit elements to expose upper surfaces of said electrode pads; forming a barrier metal layer entirely over a circuit element forming region on said substrate; forming a photo resist layer at positions corresponding to regions where said electrode pads are formed and positions for forming said scribe line or scribe line mark; forming a metal layer at portions where the photo resist layer is not formed; and removing the photo resist layer and the barrier metal layer.

3. The method of manufacturing a semiconductor wafer according to claim 1, wherein said electrode bumps and said scribe line or scribe line mark are formed of gold.

4. A semiconductor wafer, comprising:

a substrate having a scribe line or a scribe line mark formed at a prescribed position and a plurality of circuit elements fabricated integrally;

electrode bumps formed simultaneously with said scribe line or scribe line mark, on electrode pads conducting with respective said circuit elements; and an anisotropically conductive film stuck on said substrate to cover said electrode bumps and said scribe line or scribe line mark.

5. The semiconductor wafer according to claim 4, wherein said electrode bumps and said scribe line or scribe line mark are formed of gold.

6. A method of manufacturing a semiconductor chip, comprising the steps of:

fabricating a plurality of circuit elements integrally on a substrate:

forming electrode bumps on electrode pads conducting to respective said circuit elements;

forming a scribe line or scribe line mark at a prescribed position of said substrate;

sticking an anisotropically conductive film to cover said electrode bumps and the scribe line or the scribe line mark; and dicing the semiconductor wafer formed through the above described steps said circuit element by circuit element using said scribe line or the scribe line mark as a reference mark; wherein said step of forming said electrode bumps and said step of forming the scribe line or the scribe line mark are performed simultaneously.

7. The method of manufacturing a semiconductor chip according to claim 6, wherein said step of forming said electrode bumps and forming the scribe line or the scribe line mark includes the steps of forming an insulating layer protecting said circuit elements and exposing upper surfaces of said electrode pads; forming a barrier metal layer entirely over a circuit element forming region of said substrate; forming a photo resist layer to expose portions corresponding to regions where said electrode pads are formed and portions where said scribe line or the scribe line mark is formed; forming a metal layer at portions where the photo resist layer is not formed; and removing the photo resist layer and a barrier metal layer.

8. The method of management a semiconductor chip according to claim 6, wherein said electrode bumps and said scribe line or the scribe line mark are formed of gold.

9. A semiconductor chip, provided by dicing a semiconductor wafer including a substrate having a scribe line or a scribe line mark formed at a prescribed position and having a plurality of circuit elements fabricated integrally, electrode bumps formed simultaneously with said scribe line or the scribe line mark on electrode pads conducting to said circuit elements, an anisotropically conductive film stuck on said substrate to cover said electrode bumps and said scribe line or the scribe line mark, said circuit element by circuit element, using said scribe line or the scribe line mark as a reference mark.

10. A semiconductor chip according to claim 9, wherein each of said electrode bumps and said scribe line or the scribe line mark are formed of gold.

11. An IC card having a semiconductor chip, an insulating substrate on which the semiconductor chip is mounted and an antenna coil conducting to said semiconductor chip embedded in a resin card, wherein said semiconductor chip is obtained by dicing a semiconductor wafer including a substrate having a scribe line or a scribe line mark formed at a prescribed position and a plurality of circuit elements fabricated integrally, electrode bumps formed simultaneously with said scribe line or the scribe line mark on electrode pads conducting with said circuit elements, an anisotropically conductive film stuck on said substrate to cover each of said electrode bumps and said scribe line or the scribe line mark, said circuit element by circuit element using said scribe line or the scribe line mark as a reference mark.

12. The IC card according to claim 11, wherein each of said electrode bumps and said scribe line or the scribe line mark are formed of gold.

* * * * *